(12) United States Patent
Jacobsen et al.

(10) Patent No.: US 10,009,008 B2
(45) Date of Patent: *Jun. 26, 2018

(54) BULK ACOUSTIC WAVE (BAW) DEVICE HAVING ROUGHENED BOTTOM SIDE

(71) Applicant: Texas Instruments Incorporated, Dallas, TX (US)

(72) Inventors: Stuart M. Jacobsen, Frisco, TX (US); Brian Goodlin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 205 days.

This patent is subject to a terminal disclaimer.

(21) Appl. No.: 15/291,230

(22) Filed: Oct. 12, 2016

(65) Prior Publication Data
US 2017/0033766 A1 Feb. 2, 2017

Related U.S. Application Data

(66) Continuation of application No. 14/692,481, filed on Apr. 21, 2015, now Pat. No. 9,503,047, Substitute for application No. 61/987,034, filed on May 1, 2014.

(51) Int. Cl.
| | |
|---|---|
| *H03H 9/17* | (2006.01) |
| *H01L 41/08* | (2006.01) |
| *H01L 41/047* | (2006.01) |
| *H03B 28/00* | (2006.01) |
| *H03H 9/02* | (2006.01) |
| *H03B 5/32* | (2006.01) |
| *H03H 9/13* | (2006.01) |

(52) U.S. Cl.
CPC ............ *H03H 9/17* (2013.01); *H01L 41/047* (2013.01); *H01L 41/0805* (2013.01); *H03B 5/326* (2013.01); *H03B 28/00* (2013.01); *H03H 9/02055* (2013.01); *H03H 9/175* (2013.01); *H03B 2200/0022* (2013.01); *H03H 9/131* (2013.01)

(58) Field of Classification Search
CPC ... H01L 41/0805; H01L 41/04; H01L 41/047; H01L 41/471; H01L 41/081
See application file for complete search history.

(56) References Cited

U.S. PATENT DOCUMENTS

| | | |
|---|---|---|
| 6,087,198 A | 7/2000 | Panasik |
| 6,548,942 B1 | 4/2003 | Panasik |
| 7,463,118 B2 | 12/2008 | Jacobsen |
| 8,397,360 B2 | 3/2013 | Bar et al. |
| 9,503,047 B2 * | 11/2016 | Jacobsen ................ H03H 9/175 |
| 2009/0142480 A1 | 6/2009 | Godshalk et al. |
| 2009/0289526 A1 | 11/2009 | Sinha et al. |
| 2010/0293770 A1 | 11/2010 | Fuyutsume et al. |
| 2011/0248602 A1 | 10/2011 | Defay et al. |

* cited by examiner

*Primary Examiner* — Jeffrey Shin
(74) *Attorney, Agent, or Firm* — Jacqueline J. Garner; Charles A. Brill; Frank D. Cimino (57) ABSTRACT

A bulk acoustic wave (BAW) resonator includes a substrate having a top side surface and a bottom side surface. A Bragg mirror is on the top side surface of the substrate. A bottom electrode layer is on the Bragg mirror, and a piezoelectric layer is on the bottom electrode layer. A top dielectric layer is on the piezoelectric layer, and a top electrode layer is on the top dielectric layer. The bottom side surface of the substrate has a surface roughness of at least 1 μm root mean square (RMS).

36 Claims, 5 Drawing Sheets

BULK ACOUSTIC WAVE (BAW) DEVICE HAVING ROUGHENED BOTTOM SIDE

CROSS REFERENCE TO RELATED APPLICATIONS

Under 35 U.S.C. §§ 120, 119(e), this continuation application claims priority to and benefits of U.S. patent application Ser. No. 14/692,481 (TI-75048), filed on Apr. 21, 2015, which claims the benefit of Provisional Application Ser. No. 61/987,034, filed on May 1, 2014. The entirety of the above referenced applications is hereby incorporated by reference herein.

FIELD

Disclosed embodiments relate to bulk acoustic wave (BAW) devices and clock sources therefrom.

BACKGROUND

Timing devices are used as clock sources in a variety of modern electronic circuits. Such timing devices provide frequency control and timing for applications ranging from relatively simple crystal oscillators for mobile phones and radio transmitters to more complex timing devices for computers and navigational aids.

The industry standard for portable clock applications is quartz crystal tuned oscillators (XOs). The domination of XO's in the commercial market is a result of their good relative frequency accuracy, low frequency drift (or shift) as a function of temperature, and low noise. However, while the density of electronics has grown exponentially following Moore's law, the area and volume occupied by quartz crystals has not scaled accordingly.

To address the scaling issue for XOs, there have been efforts directed toward replacing the XOs with silicon microelectromechanical (MEMS)-based resonators (or oscillators) as the frequency source for clocks. Developments in semiconductor process technology, packaging, and the integration of circuitry have enabled some progress for MEMS resonators. MEMs resonators are effectively timebase generators, or timing references, similar in operating principle to a mechanical tuning fork.

One of the most highly touted features of MEMS resonators is the integration they promise for integrated circuit (IC) timing circuits. Fabricated in silicon with bulk etching processes, MEMS resonators can in principal be tied to oscillator circuits and PLLs on the same silicon (or other semiconductor) substrate. This IC combination would allow the clock and timing generators, together with the resonator, to occupy a single low-profile semiconductor package. This package, moreover, can support high-volume assembly techniques. Even where MEMS resonators and oscillators are on separate chips, they can be in the same package, such as a stacked package, one that would be smaller and easier to handle than the metal "cans" or bulky ceramic packages that currently house crystal oscillators.

One class of frequency reference components that has the potential to meet the above-described timing device needs is based on bulk acoustic wave (BAW) devices. BAWs use the piezoelectric effect to convert electrical energy into mechanical energy resulting from an applied RF voltage. BAW devices generally operate at their mechanical resonant frequency which is defined as that frequency for which the half wavelength of sound waves propagating in the device is equal to the total piezoelectric layer thickness for a given velocity of sound for the material. BAW resonators operating in the GHz range generally have physical dimensions of tens of microns in diameter with thicknesses of a few microns.

For functionality the piezoelectric layer of the BAW device is acoustically isolated from the substrate. There are two conventional structures for acoustic isolation. The first is referred to as a Thin Film Bulk Acoustic Resonator (FBAR) device. In a FBAR device the acoustic isolation of the piezoelectric layer is achieved by removing the substrate or an appropriate sacrificial layer from beneath the electroded piezoelectric resonating component to provide an air gap cavity.

The second known device structure for providing acoustic isolation is referred to as a Solidly Mounted Resonator (SMR) device. In a SMR device the acoustic isolation is achieved by having the piezoelectric resonator on top of a highly efficient acoustic Bragg reflector that is on the substrate. The acoustic Bragg reflector includes a plurality of layers with alternating high acoustic impedance layers and low acoustic impedance layers. The thickness of each of these layers is fixed to be one quarter wavelength of the resonant frequency. A variant of the SMR device adds a second Bragg mirror on the top of the piezoelectric resonator of BAW resonator.

It is known that the first-order temperature dependence of the frequency shift for a BAW resonator can be essentially "zeroed out" by introducing a dielectric layer (e.g., $SiO_2$) of an appropriate thickness. Such temperature compensating layers can be added to the resonator stack so that the BAW resonator has an extra dielectric layer (e.g., $SiO_2$) between its piezoelectric layer (e.g., AlN) and its top metal (e.g., Mo) layer. If the thickness of the dielectric layer is adjusted appropriately the dielectric layer can essentially cancel out the linear temperature coefficient of frequency (TCF) of the BAW resonator.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize even with the addition of a dielectric layer (e.g., a $SiO_2$ layer) to passively compensate a microelectromechanical (MEMS) BAW resonator (hereafter BAW resonator) for temperature induced frequency shift, problems can exist that can lead to unwanted temperature effects on frequency causing the BAW resonator to exhibit non-compliance to temperature specifications. A plot of temperature versus parts per million (ppm) frequency shift for a BAW resonator with a Bragg mirror (or reflector) on both the bottom and top although being passively compensated has been discovered to have a large "kink" in the frequency vs. temperature behavior, hereafter a temperature coefficient of frequency (TCF) kink, which has been found to occur suddenly at a temperature around a typical BAW resonator operating temperature (e.g., around 15° C.) which can lead to a frequency increase of between 100 ppm and 500 ppm over a narrow temperature range of several ° C.

It was generally found that in a random selection of BAW resonator die from a given completed substrate (e.g., wafer, such as a silicon wafer), this sudden and undesirable TCF kink effect occurs at arbitrary temperatures, generally making it not possible to predict or control. This effect has been discovered to be caused by mode-hopping due to coupling of the main cavity resonance of the BAW resonator with a second mode resulting from reflection of acoustic waves from the backside of substrate.

Disclosed embodiments solve the significant TCF kink behavior of known BAW resonator devices by providing a roughened bottom side surface that provides at least 1 µm of root mean square (RMS) over an area of at least 100 µm$^2$. As used herein, a "roughened bottom side surface" is located below the Bragg mirror beneath the piezoelectric transducer that is generally, but not necessarily, the exposed bottom side surface of the BAW resonator. The RMS roughness is generally over the entire area of the BAW resonator, which is typically in the range of ~10,000 µm$^2$, so that there is an absence of mirror-like surfaces within that area that might lead to back-reflecting the unwanted acoustic mode.

One method thins the wafer at wafer level by a wafer thinning process such as the process known as backgrinding, in one specific embodiment by using a 400 grit grinding element which results in the wafer bottom surface having a resulting surface roughness of around 2 microns RMS. During backgrind, substrate material (e.g., silicon) is lapped off so that the thickness may be reduced from beginning at around 725 µm (for a 200 mm silicon wafer) to around 200 µm. However, instead of conventional fine polishing of the surface after backgrind, the substrate (e.g., wafer) is deliberately left with a roughened backside surface. Conventional fine polishing after backgrind typically results in an RMS roughness of about 200 Angstroms, or less.

With a disclosed roughened backside surface it has been discovered that the acoustic waves "leaking" from the bottom mirror of disclosed BAW resonators are instead scattered (and/or absorbed) at the surface, and thus do not return to the main cavity to introduce the mode hopping effect when the temperature of the system allows this condition to happen. Disclosed embodiments solve the TCF kink problem for BAW resonators and thus maintain a stable profile of frequency versus temperature, making disclosed BAW resonators more useful as frequency references, such as for single chip BAW-resonator based clock generators.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Mode hopping mechanisms are described below that are believed to explain the observed phenomena provided by disclosed embodiments. Although the mechanism(s) described herein are believed to be accurate, disclosed embodiments may be practiced independent of the particular mechanism(s) that may be operable.

Figure 1:
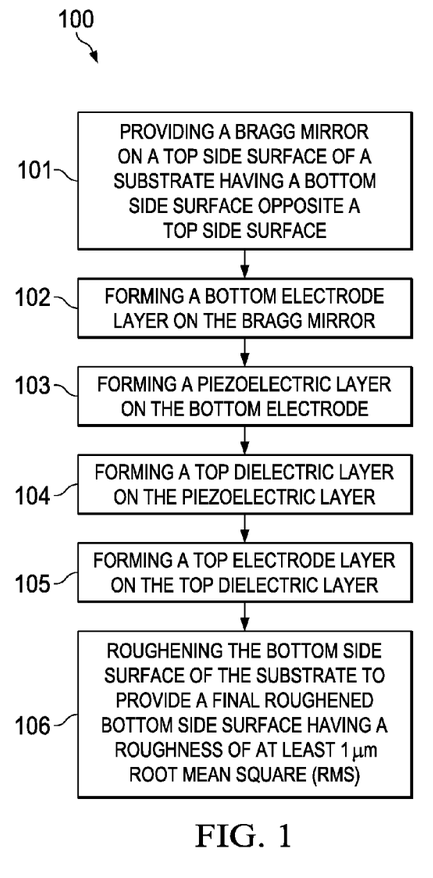
FIG. 1 is a flow chart that shows steps in an example method for forming a BAW resonator having a roughened bottom side surface, according to an example embodiment.

FIG. 1 is a flow chart that shows steps in an example method 100 for forming a BAW resonator having a roughened bottom side, according to an example embodiment. Step 101 comprises providing a Bragg mirror on a top side surface of a substrate having a bottom side surface opposite a top side surface. The substrate can comprise a variety of different materials including silicon, silicon carbide (SiC), sapphire (Al$_2$O$_3$) or glass. The silicon can be n-type or p-type, in a wide range of doping levels.

Step 102 to 105 described below form a piezoelectric transducer. Step 102 comprises forming a bottom electrode layer on the Bragg mirror. One example metal for the bottom electrode layer is Mo. Other example possibilities for the bottom electrode layer include Pt, W and Ir.

Step 103 comprises forming a piezoelectric layer on the bottom electrode layer. One example piezoelectric layer material is AlN. Other example possibilities for the piezoelectric layer include ZnO and Lead Zirconate Titanate (PZT).

Step 104 comprises forming a top dielectric layer on the piezoelectric layer. The top dielectric layer comprises a material having a positive room temperature elastic modulus, such as silicon oxide. The top dielectric layer can comprise other materials, such as silicon oxynitride or silicon nitride.

Step 105 comprises forming a top electrode layer on the top dielectric layer to complete the piezoelectric transducer. One example metal for the top electrode layer is Mo. Other example possibilities for the top electrode layer include Pt, W and Ir.

Step 106 comprises roughening the bottom side surface of the substrate to provide a final roughened bottom side surface having a roughness of at least 1 μm RMS. The roughening process can comprise backgrinding. The roughening can also comprise wet or dry (e.g., plasma) etching. As a particular example for wet etching of a silicon wafer, a hydroxide-based wet etch may be used, such as tetramethylammonium hydroxide (TMAH) or potassium hydroxide (KOH). The surface being etched can be engineered in combination with a high selectivity etch process to create micro-masked surface roughening, for example by providing localized oxide regions that act as etch masks.

Method 100 excludes a conventional polishing step(s) after the roughening so as to maintain the bottom side surface RMS roughness of ≥1 μm. As noted above, the "roughened bottom side surface" is a roughened surface below the Bragg mirror that is beneath the piezoelectric transducer, which is generally, but not necessarily, the exposed bottom side surface of the BAW resonator.

The surface roughness is generally from 1 μm RMS to 5 μm RMS. It is possible for higher levels of roughness such as 5 μm to 10 μm RMS. Also, an RMS roughness above about 5 μm may have a detrimental effect on the edge quality of the sawn die in some cases leading to unacceptable chip-out and a packaged device yield loss.

Figure 2A:
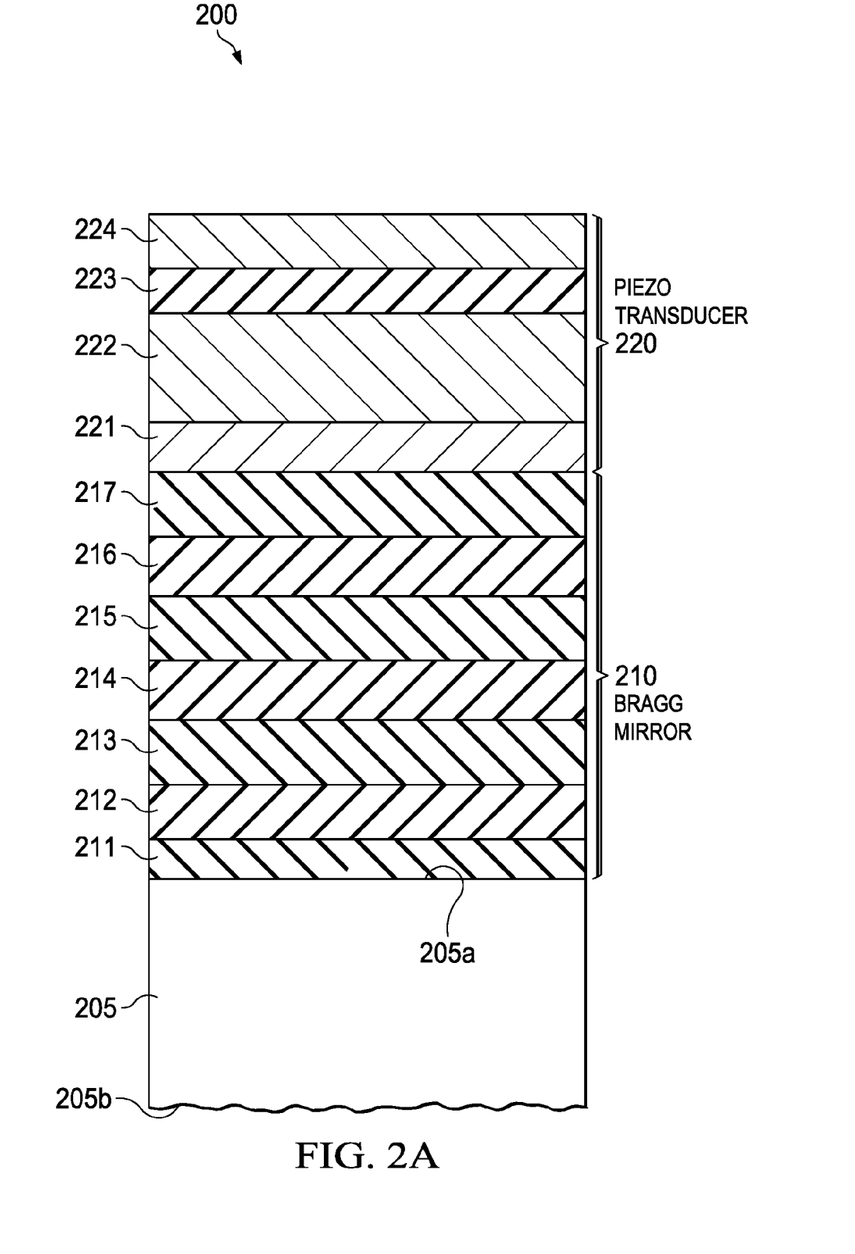
FIG. 2A is a cross sectional depiction of an example BAW resonator having a roughened bottom side surface including a bottom Bragg mirror, according to an example embodiment.

FIG. 2A is a cross sectional depiction of an example BAW resonator 200 having a roughened bottom side, embodied as a Solidly Mounted Resonator (SMR) device, according to an example embodiment. BAW resonator 200 includes a substrate 205 having a top side surface 205a and a bottom side surface 205b. A Bragg mirror 210 is on the top side surface 205a of the substrate. Bragg mirror 210 comprises a plurality of layers with alternating high and low acoustic impedance layers, with the relatively high acoustic impedance layers shown as 212, 214 and 216, alternating with the relatively low acoustic impedance layers 211, 213, 215 and 217. The thickness of each of these layers 211-217 is fixed to be about one quarter wavelength of the desired resonant frequency.

A piezoelectric transducer 220 includes a bottom electrode layer 221 that is on layer 217 of the Bragg mirror 210, a piezoelectric layer 222 on the bottom electrode layer 221, a dielectric layer 223 on the piezoelectric layer 222, and a top electrode layer 224 on the dielectric layer. The bottom side surface 205b of the substrate is depicted having surface features throughout that provides a surface roughness of at least 1 μm RMS.

One possible recognized disadvantage of the embodiment described in FIG. 2A is that the top surface of the BAW resonator 200 acts as an acoustic reflector through the properties of a solid/air interface in order to prevent mechanical energy from leaking out of the system from the top side. This means that for a practical BAW resonator device for use as a frequency reference there should generally be measures taken to create an air cavity in the final package. However, this is generally a high cost solution involving either hermetic package level technology or hermetic wafer bonding for a wafer level solution. If the final top side air cavity is not hermetically sealed off the resonator can drift in frequency over time as the top surface becomes contaminated through deposition of molecules and/or particles. This problem is overcome in another SMR embodiment illustrated in FIG. 2B that has both a bottom Bragg mirror 210 and a top Bragg mirror 240, which is also described in U.S. Pat. No. 6,087,198 entitled "Low Cost Packaging for Thin Film Resonators and Resonator Based Filters" and U.S. Pat. No. 6,548,942 entitled "Encapsulated Packaging for Thin Film Resonators" both to Carl Panasik and assigned to Texas Instruments Incorporated, assignee of this Application.

Figure 2B:
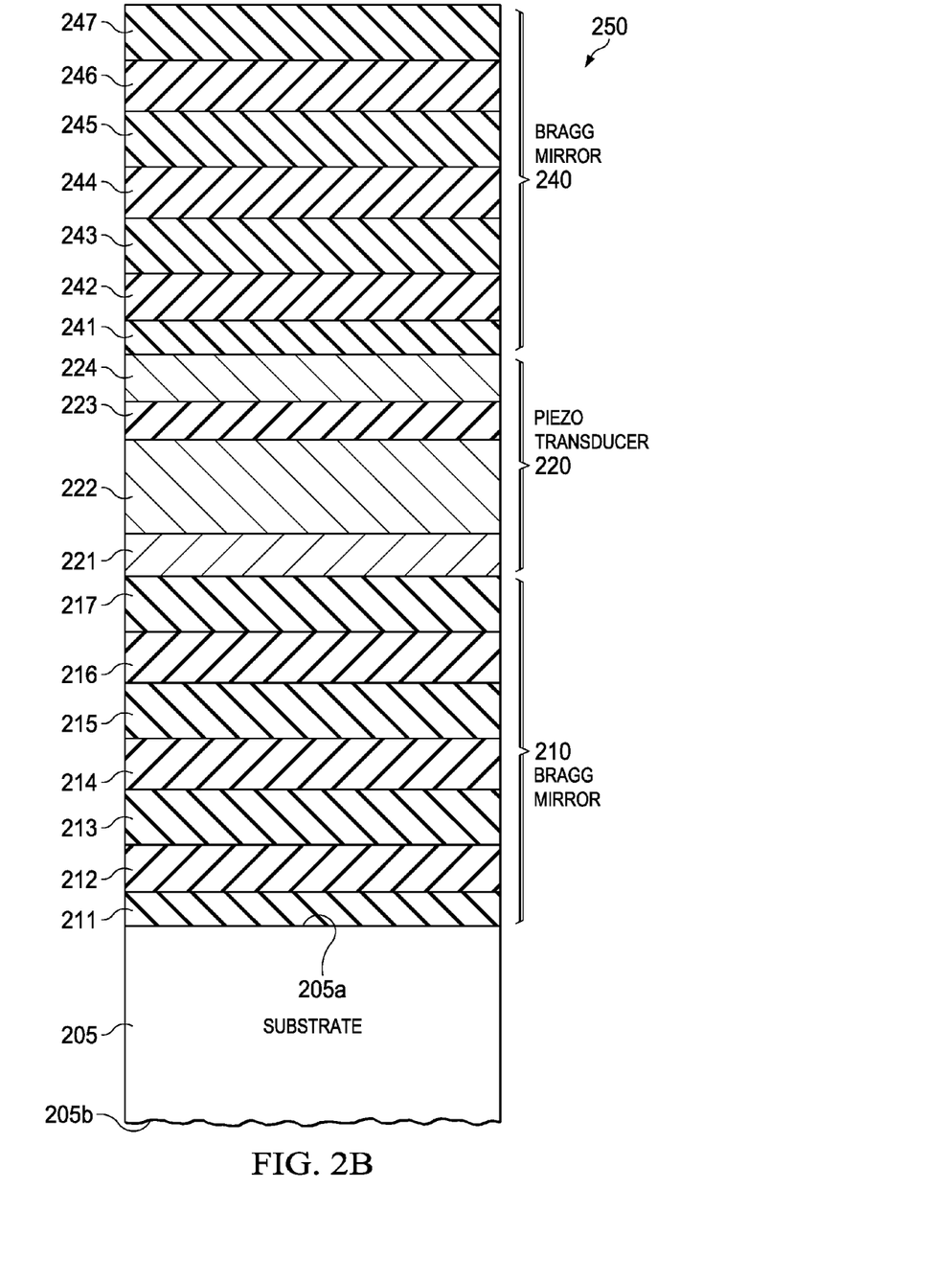
FIG. 2B is a cross sectional depiction of another example BAW resonator having a roughened bottom side surface including a bottom Bragg mirror and a top Bragg mirror, according to an example embodiment.

FIG. 2B is a cross sectional depiction of BAW resonator 250 embodied as a SMR having a roughened bottom side surface including both a bottom Bragg mirror 210 and a top Bragg mirror 240, according to an example embodiment. Analogous to bottom Bragg mirror 210, the top Bragg mirror 240 comprises a plurality of layers with alternating high and low acoustic impedance layers, with the relatively high acoustic impedance layers shown as 242, 244 and 246, alternating with the relatively low acoustic impedance layers 241, 243, 245 and 247. The thickness of each of these layers 241-247 is fixed to be about one quarter wavelength of the desired resonant frequency.

In this embodiment the top Bragg mirror 240 is deposited on top of the BAW resonator 200 shown in FIG. 2A. This results in a BAW resonator 250 which becomes essentially immune to frequency shifts caused by the deposition on contaminants on the piezoelectric transducer 220. If the top Bragg mirror 240 is efficient enough the frequency of the BAW resonator 250 will not change by more than 1 part per million (ppm) even if a thick mold compound is used in assembly, being a low cost standard packaging solution, is deposited on top.

Figure 3A:
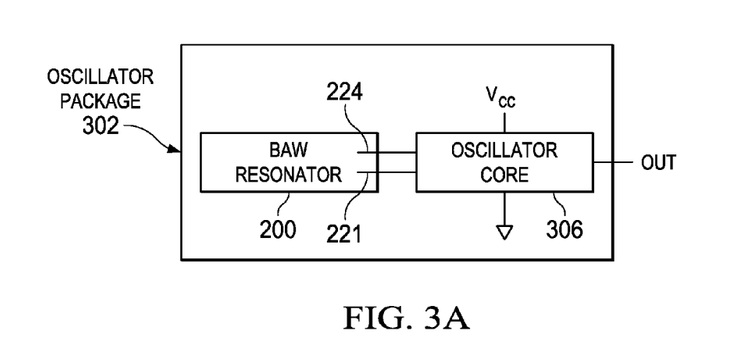
FIG. 3A is a block diagram depiction of an oscillator including a disclosed BAW resonator having a roughened bottom side surface, according to an example embodiment.

FIG. 3A is a block diagram depiction of an oscillator package 302 including a disclosed BAW resonator 200 having a roughened bottom side surface coupled together with an oscillator core 306, according to an example embodiment. The package can be a stacked package (e.g., flip chip assembly) or a lateral package arrangement. It may also be possible for the BAW resonator 200 and oscillator core 306 to be formed on the same die. The oscillator core 306 has bond pads (not shown) for being coupled between a high voltage supply terminal shown as VCC and a low voltage shown as a ground, and to the electrodes 224 and 221 of the piezoelectric transducer 220 of the BAW resonator 200. The piezoelectric transducer 220 of the BAW resonator 200 functions as a reference signal generator which provides the signal input for the oscillator core 306.

Oscillator core 306 comprises active and passive circuit elements (e.g., capacitors) capable of sustaining oscillations and amplifying the signal from the piezoelectric transducer 220 of the BAW resonator 200 to provide the output signal shown as shown as OUT. The construction of the BAW resonator 200 (the thickness of the piezoelectric layer 222) selects the oscillation frequency. Regarding oscillator core, it can in one particular example comprise a Colpitts oscillator.

Figure 3B:
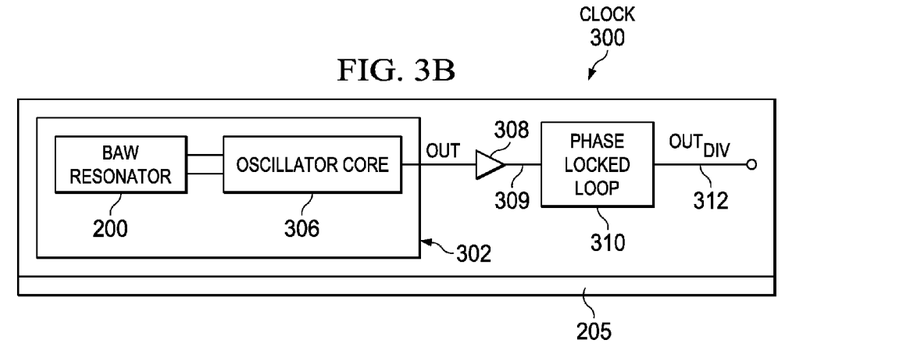
FIG. 3B is a block diagrams depiction of a clock generator chip including the oscillator shown in FIG. 3A together with a frequency divider, according to an example embodiment.

FIG. 3B is a block diagram depiction of a clock generator chip 300 including the oscillator package 302 shown in FIG. 3A together with a frequency divider shown as a phase-lock-loop (PLL) 310. The output of the oscillator package 302 shown as OUT is processed by a gain buffer 308 which outputs an amplified buffered reference signal 309, which can also include at least one filter for signal filtering. The PLL 310 divides the frequency of the amplified OUT shown as 309 received to reach a desired divided down frequency shown as $OUT_{DIV}$, where $OUT_{DIV}$ provides the clock output for the clock generator chip 300.

When fabricated in silicon using bulk etching processes, disclosed MEMS-based BAW resonators can be one chip in a package coupled to another chip having the oscillator core, amplifier, and frequency divider (e.g., PLL), such as to form the clock generator chip 300 shown in FIG. 3B. This IC combination allows the clock and timing generators, together with the BAW resonator, to occupy a single low-profile semiconductor package. This package, moreover, can support high-volume assembly techniques. At least the oscillator core 306, amplifier 308, and frequency divider (e.g., PLL 310) of the clock generator chip 300 can share the same substrate with a wide variety of semiconductor devices that it provides timing for. Specific examples include a processor, such as a microprocessor, digital signal processor (DSP) or microcontroller unit (MCU).

EXAMPLES

Disclosed embodiments are further illustrated by the following specific Examples, which should not be construed as limiting the scope or content of this Disclosure in any way.

Figure 4A:
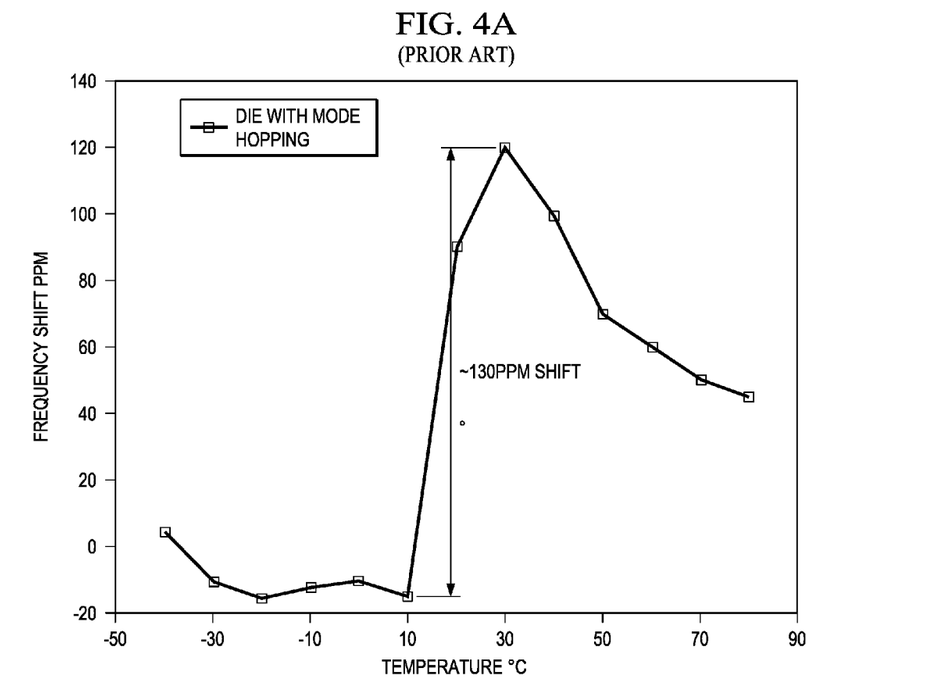
FIG. 4A is data showing the frequency shift vs. temperature performance for a known BAW device showing TCF kinks.
Figure 4B:
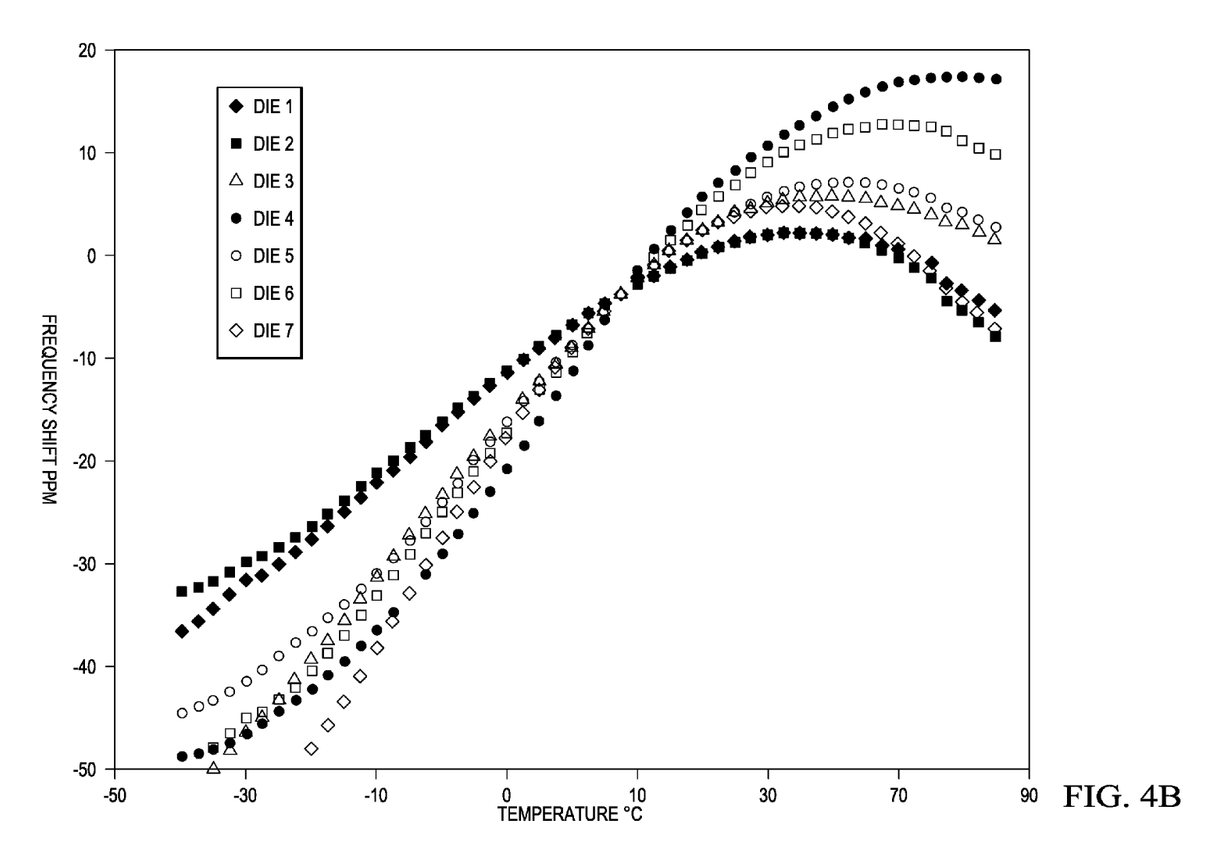
FIG. 4B is data showing the frequency shift vs. temperature performance for a disclosed BAW device having a roughened bottom side showing no TCF kinks, according to an example embodiment.

FIG. 4A is data showing the frequency shift (in ppm) vs. temperature (in ° C.) performance for a known BAW device provided as a reference for comparison shown as a "die with mode hopping" which may be considered to have an "activity dip" from its TCF kink being a sudden arbitrary shift in frequency of about 130 ppm shown. FIG. 4B is data showing the frequency shift vs. temperature performance for a disclosed BAW device having a roughened bottom side showing no TCF kinks, according to an example embodiment. The BAW resonator die tested were from same silicon wafer that had a rough silicon substrate finish provided by back-lapping across their full area having an RMS roughness of about 2 μm. No TCF kinks are observed in any of the die shown in FIG. 4B.

Disclosed embodiments may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:
1. A bulk acoustic wave (BAW) resonator, comprising:
a substrate having a top side surface, and a bottom side surface opposite the top side surface, the bottom side surface roughened and unpolished;
a Bragg mirror on the top side surface; and
a piezo transducer on the Bragg mirror,
wherein the bottom side surface of the substrate has a surface roughness of at least 1 μm root mean square (RMS).
2. The BAW resonator of claim 1, wherein the piezo transducer includes:
a bottom electrode on the Bragg mirror;
a piezo layer on the bottom electrode;
a dielectric layer on the piezo layer; and
a top electrode on the dielectric layer.
3. The BAW resonator of claim 2, wherein the dielectric layer has a positive room temperature elastic modulus.
4. The BAW resonator of claim 2, wherein the dielectric layer includes a silicon oxide material.

5. The BAW resonator of claim 1, wherein the bottom side surface of the substrate has a surface roughness ranges from 1 μm root mean square (RMS) to 5 μm RMS.
6. The BAW resonator of claim 1, wherein the bottom side surface of the substrate is roughed by backgrinding.
7. The BAW resonator of claim 1, wherein the bottom side surface of the substrate is roughed by either one of wet etching or dry etching.
8. The BAW resonator of claim 1, further comprising:
a top Bragg mirror on the piezo transducer.
9. The BAW resonator of claim 1, wherein the substrate includes a silicon material.
10. An oscillator, comprising:
a bulk acoustic wave (BAW) resonator, including
a substrate having a top side surface, and a bottom side surface opposite the top side surface, the bottom side surface roughened and unpolished;
a Bragg mirror on the top side surface; and
a piezo transducer on the Bragg mirror; and
an oscillator core coupled to the piezo transducer,
wherein the bottom side surface of the substrate has a surface roughness of at least 1 μm root mean square (RMS).
11. The oscillator of claim 10, wherein the piezo transducer includes:
a bottom electrode on the Bragg mirror and coupled to the oscillator core;
a piezo layer on the bottom electrode;
a dielectric layer on the piezo layer; and
a top electrode on the dielectric layer and coupled to the oscillator core.
12. The oscillator of claim 11, wherein the dielectric layer has a positive room temperature elastic modulus.
13. The oscillator of claim 11, wherein the dielectric layer includes a silicon oxide material.
14. The oscillator of claim 10, wherein the bottom side surface of the substrate has a surface roughness ranges from 1 μm root mean square (RMS) to 5 μm RMS.
15. The oscillator of claim 10, wherein the bottom side surface of the substrate is roughed by backgrinding.
16. The oscillator of claim 10, wherein the bottom side surface of the substrate is roughed by either one of wet etching or dry etching.
17. The oscillator of claim 10, further comprising:
a top Bragg mirror on the piezo transducer.
18. The oscillator of claim 10, wherein the substrate includes a silicon material.
19. A bulk acoustic wave (BAW) resonator, comprising:
a substrate having a top side surface, and a bottom side surface opposite the top side surface, the bottom side surface roughened and unpolished;
a Bragg mirror on the top side surface; and
a piezo transducer including:
a bottom electrode on the Bragg mirror;
a piezo layer on the bottom electrode;
a dielectric layer on the piezo layer; and
a top electrode on the dielectric layer.
20. The BAW resonator of claim 19, wherein the dielectric layer has a positive room temperature elastic modulus.
21. The BAW resonator of claim 19, wherein the dielectric layer includes a silicon oxide material.
22. The BAW resonator of claim 19, wherein the bottom side surface of the substrate has a surface roughness of at least 1 μm root mean square (RMS).
23. The BAW resonator of claim 19, wherein the bottom side surface of the substrate has a surface roughness ranges from 1 μm root mean square (RMS) to 5 μm RMS.

24. The BAW resonator of claim 19, wherein the bottom side surface of the substrate is roughed by backgrinding.

25. The BAW resonator of claim 19, wherein the bottom side surface of the substrate is roughed by either one of wet etching or dry etching.

26. The BAW resonator of claim 19, further comprising:
a top Bragg mirror on the piezo transducer.

27. The BAW resonator of claim 19, wherein the substrate includes a silicon material.

28. An oscillator, comprising:
a bulk acoustic wave (BAW) resonator, including
   a substrate having a top side surface, and a bottom side surface opposite the top side surface, the bottom side surface roughened and unpolished;
   a Bragg mirror on the top side surface; and
   a piezo transducer including:
      a bottom electrode on the Bragg mirror and coupled to the oscillator core;
      a piezo layer on the bottom electrode;
      a dielectric layer on the piezo layer; and
      a top electrode on the dielectric layer; and
an oscillator core coupled to the top electrode of the piezo transducer.

29. The oscillator of claim 28, wherein the dielectric layer has a positive room temperature elastic modulus.

30. The oscillator of claim 28, wherein the dielectric layer includes a silicon oxide material.

31. The oscillator of claim 28, wherein the bottom side surface of the substrate has a surface roughness of at least 1 µm root mean square (RMS).

32. The oscillator of claim 28, wherein the bottom side surface of the substrate has a surface roughness ranges from 1 µm root mean square (RMS) to 5 µm RMS.

33. The oscillator of claim 28, wherein the bottom side surface of the substrate is roughed by backgrinding.

34. The oscillator of claim 28, wherein the bottom side surface of the substrate is roughed by either one of wet etching or dry etching.

35. The oscillator of claim 28, further comprising:
a top Bragg mirror on the piezo transducer.

36. The oscillator of claim 28, wherein the substrate includes a silicon material.

* * * * *